United States Patent
Ullmann et al.

(10) Patent No.: US 9,240,684 B2
(45) Date of Patent: Jan. 19, 2016

(54) OVERVOLTAGE PROTECTION FOR ELECTRICALLY CONDUCTIVE STRUCTURES

(75) Inventors: Andreas Ullmann, Zirndorf (DE); Thomas Herbst, Edelsfeld (DE); Ludwig Brehm, Adelsdorf (DE); Haymo Katschorek, Obermichelbach (DE)

(73) Assignee: PolyIC GmbH & CO. KG, Furth (DE)

( * ) Notice: Subject to any disclaimer, the term of this patent is extended or adjusted under 35 U.S.C. 154(b) by 208 days.

(21) Appl. No.: 13/878,650

(22) PCT Filed: Oct. 10, 2011

(86) PCT No.: PCT/EP2011/005050
§ 371 (c)(1),
(2), (4) Date: Jun. 4, 2013

(87) PCT Pub. No.: WO2012/048840
PCT Pub. Date: Apr. 19, 2012

(65) Prior Publication Data
US 2013/0265679 A1   Oct. 10, 2013

(30) Foreign Application Priority Data

Oct. 11, 2010  (DE) .................... 10 2010 047 912

(51) Int. Cl.
| | |
|---|---|
| H02H 9/00 | (2006.01) |
| H02H 9/04 | (2006.01) |
| H05K 1/02 | (2006.01) |
| H05K 13/04 | (2006.01) |
| H05K 1/16 | (2006.01) |

(52) U.S. Cl.
CPC ............ *H02H 9/041* (2013.01); *H05K 1/0259* (2013.01); *H05K 13/04* (2013.01); *H05K 1/167* (2013.01); *H05K 2201/09781* (2013.01); *H05K 2203/1545* (2013.01); *H05K 2203/175* (2013.01); *Y10T 29/49155* (2015.01)

(58) Field of Classification Search
CPC .......................................... H01T 4/08
USPC .......................................... 361/112
See application file for complete search history.

(56) References Cited

U.S. PATENT DOCUMENTS

| | | | |
|---|---|---|---|
| 5,023,751 A | | 6/1991 | Satmpfli |
| 5,237,201 A | | 8/1993 | Tanski et al. |
| 5,969,924 A | * | 10/1999 | Noble ............................. 361/56 |
| 6,493,198 B1 | * | 12/2002 | Arledge et al. ................. 361/56 |

(Continued)

FOREIGN PATENT DOCUMENTS

| | | |
|---|---|---|
| AT | 79982 | 12/1988 |
| DE | 3322679 | 1/1985 |

(Continued)

*Primary Examiner* — Stephen W Jackson
(74) *Attorney, Agent, or Firm* — William Squire

(57) ABSTRACT

There is described a structure (14) that is disposed on an electrically non-conductive, electrostatically chargeable strip-type carrier film (12) and that has electrically conductive and/or semiconducting structural elements, which structure has at least one structural region (14s) protected against electrostatic voltage flashover. The at least one structural region (14s) protected against electrostatic voltage flashover is connected to a protective conductor track (19) and/or surrounded by a protective conductor track (19, 19'), which is realized such that it discharges an electrostatic charge and/or shields the protected structural region (14s).

24 Claims, 4 Drawing Sheets

(56) References Cited

U.S. PATENT DOCUMENTS

Figure 1:
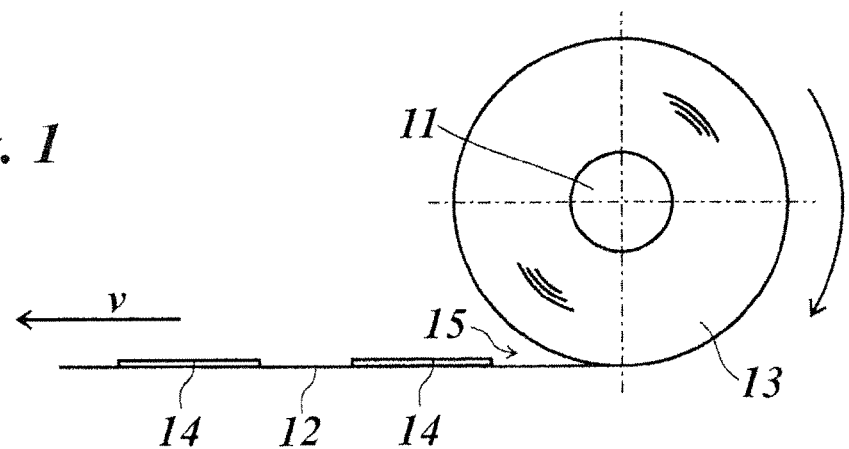

| | | | |
|---|---|---|---|
| 8,217,432 B2 | 7/2012 | Ullmann et al. | |
| 8,720,951 B2 * | 5/2014 | Brehm et al. | 283/72 |
| 2002/0139569 A1 | 10/2002 | Dodsworth | |
| 2006/0068164 A1 | 3/2006 | Iguchi | |
| 2006/0117554 A1 | 6/2006 | Herrmann et al. | |

FOREIGN PATENT DOCUMENTS

| | | |
|---|---|---|
| DE | 102006047388 | 4/2008 |
| DE | 10 2007 062944 | 6/2009 |
| EP | 0 299 768 | 1/1989 |
| EP | 1 031 940 | 8/2000 |

* cited by examiner

OVERVOLTAGE PROTECTION FOR ELECTRICALLY CONDUCTIVE STRUCTURES

The invention relates to a film having an overvoltage protection for electrically conductive structures, which are applied to the film, and to a method for producing the film.

During or after the production of conductive structures on carrier films by means of roll-to-roll processes, extremely high static electrical voltages can occur in the electrically non-conducting carrier film as a result of friction between rollers and the carrier film, or as a result of the reeling-up and unreeling of the carrier film. These voltages are taken up and carried by the electrically conductive structures applied to the carrier film. As the film is being separated from the film reel, this voltage runs on concomitantly in the separation gap between the film and the film reel. At the end regions of the conductive structures, a voltage flashover occurs, from this structure into the succeeding structure or into the opposite side of the roll. This voltage flashover can damage the structure, with the result that the latter no longer conforms to the specified layout.

The object of the present invention is to create a film having overvoltage protection for applied electrically conductive structures, and to specify such a method.

This object is achieved, according to the invention, with a film comprising an electrically non-conductive, electrostatically chargeable strip-type carrier film and a structure that is disposed on the carrier film and that has electrically conductive and/or semiconducting structural elements, wherein it is provided that the structure has at least one structural region protected against electrostatic voltage flashover, that the protected one or more electrically conductive or semiconducting structural elements disposed in the at least one structural region protected against electrostatic voltage flashover are connected to a protective conductor track and/or are surrounded by a protective conductor track, which is realized such that it discharges an electrostatic charge and/or shields the protected structural region.

The object of the invention is further achieved with a method for realizing a film comprising an electrically non-conductive, electrostatically chargeable strip-type carrier film and a structure that is disposed on the carrier film and that has electrically conductive and/or semiconducting structural elements, wherein it is provided that the one or more electrically conductive or semiconducting structural elements are connected to a protective conductor track that is disposed on the carrier film and/or are surrounded by protective conductor tracks, which is or are realized such that it or they discharges or discharge an electrostatic charge and/or shields or shield the protected structural region.

The protective conductor track integrated into the structure to be protected does not require any additional resource in respect of equipment or technology, and can therefore be realized at low cost. The protective conductor track provides the current that is caused by the overvoltage with a defined, low-resistance current path, whereby damage to the protected structure is prevented.

The carrier film can be a film composed of PET, PN, PP, etc. The film can have a thickness in the range of from 5 µm to 250 µm.

The structure applied to the carrier film can be constructed from one or more layers disposed over one another, wherein the layers can have a thickness in the range of from 10 nm to 10 µm.

The protected structural element or the protected structural elements are preferably composed of one or more layers, applied to the carrier film, which are selected from the group comprising electrically conductive layer, electrically semiconducting layer and electrically insulating layer. Preferably, one or more of these layers are applied by means of a printing method, for example gravure printing, offset printing, pad printing or screen printing. The protected structural elements are preferably constituted by field-effect transistors, diodes, resistors, capacitors or sub-elements of such electronic components, which are constituted by one or more layers disposed over one another on the carrier film.

The protective conductor track can be composed, for example, of Ag or Cu. It can have a width of 5 µm to 1 mm, and have a thickness in the range of from 10 nm to 500 nm.

The protective conductor track or protective conductor tracks and electrodes of the protected electrically conductive or semiconducting structural elements are preferably realized as part of a common electrically conductive layer of the film. Electrodes of the protected electrically conductive or semiconducting structural elements are thus preferably realized in one and the same production process as the protective conductor tracks.

Preferably, the electrodes realized in this common electrically conductive layer are in this case realized as electrodes of a field-effect transistor, diode, resistor or capacitor.

Preferably, following realization of the common electrically conductive layer in which the protective conductor tracks and electrodes of the protected electrically conductive or semiconducting structural elements are realized, the common electrically conductive layer is printed, partially or over its full surface, with an electrically insulating or an electrically semiconducting layer.

It can be provided that the protective conductor track short-circuits a structural element disposed in the protected structural region, in that it is connected to the structural element via connecting portions.

It can be provided that, after the structure has been separated from the strip reel, the protective conductor track is separated off from the structure. A cutting line can be provided, along which the protective conductor track can be separated off from the structure. The cutting line can be defined as a dimensional parameter, for example in a setting of a cutting tool and/or as a structure having reduced strength. The structure having reduced strength can be, for example, a break notch or a perforation.

It can be provided that the protected structural region is realized as a fuse realized as a conductor track. Without the protection according to the invention, line portions provided as a fuse, in particular, would be endangered by the effect of overvoltage, because they have to be realized with a significantly smaller line cross section than the rest of the conductor track portions, and they therefore preferably melt through in the case of overvoltage.

It can further be provided that the protected structural element is realized as a field-effect transistor, diode, resistor or capacitor, or as a partial region thereof. The partial region can be realized, for example, from the lower electrodes of a field-effect transistor constructed as a multilayer component.

The connecting portions can be electrically connected, directly or indirectly, to the terminal connections of the protected structural element.

According to a preferred embodiment example of the invention, two or more protective conductor tracks are provided, which are connected to supply lines of the protected structural element. Preferably, these protective conductor tracks are disposed along the outer edges of the protected structural region and surround at least 50%, preferably at least 75%, and more particularly preferably at least 90% of the latter. It is further advantageous that the protective conductor is located "deeper" and/or "higher" in the direction of running than the structure that is to be protected, in order to guide the charge into this region before the charge jumps over.

The protective conductor tracks can be realized such that they constitute a ring that is at least 50% closed, preferably a ring that is at least 75% closed, and more particularly preferably a ring that is at least 90% closed.

A flashover region is preferably realized between adjacent protective conductor tracks. The flashover region is preferably located above and/or beneath the structural element to be protected, in relation to the direction of running.

The flashover region can have a gap width in the range of from 1 μm to 100 μm.

Further, it can be provided that the protective conductor track is disposed such that the flashover region is disposed over and/or under the structure to be protected, in relation to the direction of running. It can further be disposed substantially parallel to the direction of running of the strip-type carrier film.

It can also be provided that the protective conductor track is disposed substantially transverse to the direction of running of the strip-type carrier film.

According to a preferred embodiment example of the invention, one or more protective conductor tracks are provided, which are each connected to a supply line or an electrode of the protected structural element, and which have an end portion for discharging overvoltages. The end portion in this case preferably has a length of more than 1 mm, particularly preferably of more than 10 mm. The length of the end portion is particularly preferably less than or equal to 20 cm, particularly preferably less than less than 10 cm. The length of the end portion is particularly preferably between 1 mm and 20 cm, particularly preferably between 10 mm and 10 cm. The width of the end portion is preferably between 10 μm and 200 μm, particularly preferably between 50 μm and 150 μm.

The function of the end portion here is to direct the voltage, resulting from a charge flashover, away on to another layer of the film, or on to a working tool, for example a roller, over which the film is running. This charge flashover usually results in a portion of the end portion being destroyed. Owing to the advantageous dimensions of the end portion that are described above, in this case such a charge flashover can be effected safely and at a distance from the structural element to be protected, such that the structural element that is to be protected is not destroyed in this case.

The end portion is preferably realized in the form of a conductor track, one end of which has an outside face for discharging overvoltages, and the other end of which is connected, via a connecting portion of the protective conductor track, to the supply line or the electrode of the protected structural element. Thus, apart from this conductor track portion, the end portion is not connected to any conductive structure of the film. Owing to the absence of contacting to other conductive structures, the charges intercepted or discharged by the connecting portion accumulate in the end of the end portion that is opposite the connecting portion, with the result that the charge flashover occurs at the outside face of this end. Preferably, in this case, this outside face of the end portion is disposed at a distance of between 1 mm and 20 cm, preferably at least 1 cm, from the protected structural region. The end portion is preferably shaped such that it tapers towards this outside face, in order to achieve a safe charge flashover. Further, the end portion preferably has a length range of between 1 mm and 5 cm, preferably between 0.5 cm and 1.5 cm, which is designed to be destroyed upon discharging of overvoltages.

Preferably the end portion extends substantially longitudinal to the direction of running of the strip-type carrier film, and is therefore oriented parallel to the longitudinal direction of the carrier film. Trials have shown that such an orientation of the end portion ensures to a large extent that a charge flashover occurs at an early stage in the passage through production machines, before a critical quantity of charge accumulates. Further, it has been found in this case that the outside face of the end portion is preferably to be disposed on the side of the protected structural element opposite from the direction of running.

The connecting portion is preferably oriented transverse to the direction of running of the strip-type carrier film, i.e. transverse to the direction of running of the carrier film. It has been found that this achieves the advantage that, as a result, connecting portions charges that might impair the protected structural elements are better discharged, because of being oriented transverse to the rotation axis of the rollers of the production machines.

The length of the connecting portion is preferably between 0.5 and 1.5 cm. The thickness of the connecting portion is preferably selected to be greater than the thickness of the end portion, preferably at least twice as great as the thickness of the end portions.

Preferably, the protective conductor tracks are configured in an L shape.

Further, it is advantageous if two or more of the end portions of protective conductor tracks are disposed parallel to each other. Preferably in this case, these end portions that are disposed parallel extend substantially parallel to the direction of running of the strip-type carrier film or substantially transverse to the direction of running of the strip-type carrier film. As a result, amongst other things, this also achieves the advantage that the (partially destroyed) end portions can be easily removed in an end phase of the production process, and that the charge flashovers can be concentrated on a region of the film designed for this purpose.

Preferably, the connecting portions in this case are then shaped such that these connect the supply lines or electrodes of the protected structural elements to the end portions, disposed parallel, in a correct circuit arrangement.

Further, it is also possible for the connecting portions to be oriented parallel or substantially parallel to the end portions. Further, it is also possible for the connecting portions to be absent, and for the end portions to be connected directly to a supply line or to an electrode of the protected structural element.

Extending substantially parallel and substantially in the direction of running or transverse to the direction of running is to be understood to mean a deviation of not more than 20%, preferably not more than 10%.

It can be provided that the method according to the invention is a stage of a roll-to-roll process. The roll-to-roll process has proved successful, in particular, for inexpensive mass production of electronic printed circuits and the like.

The invention is now explained in more detail with reference to embodiment examples. There are shown in:

IN THE DRAWING

Figure 2:
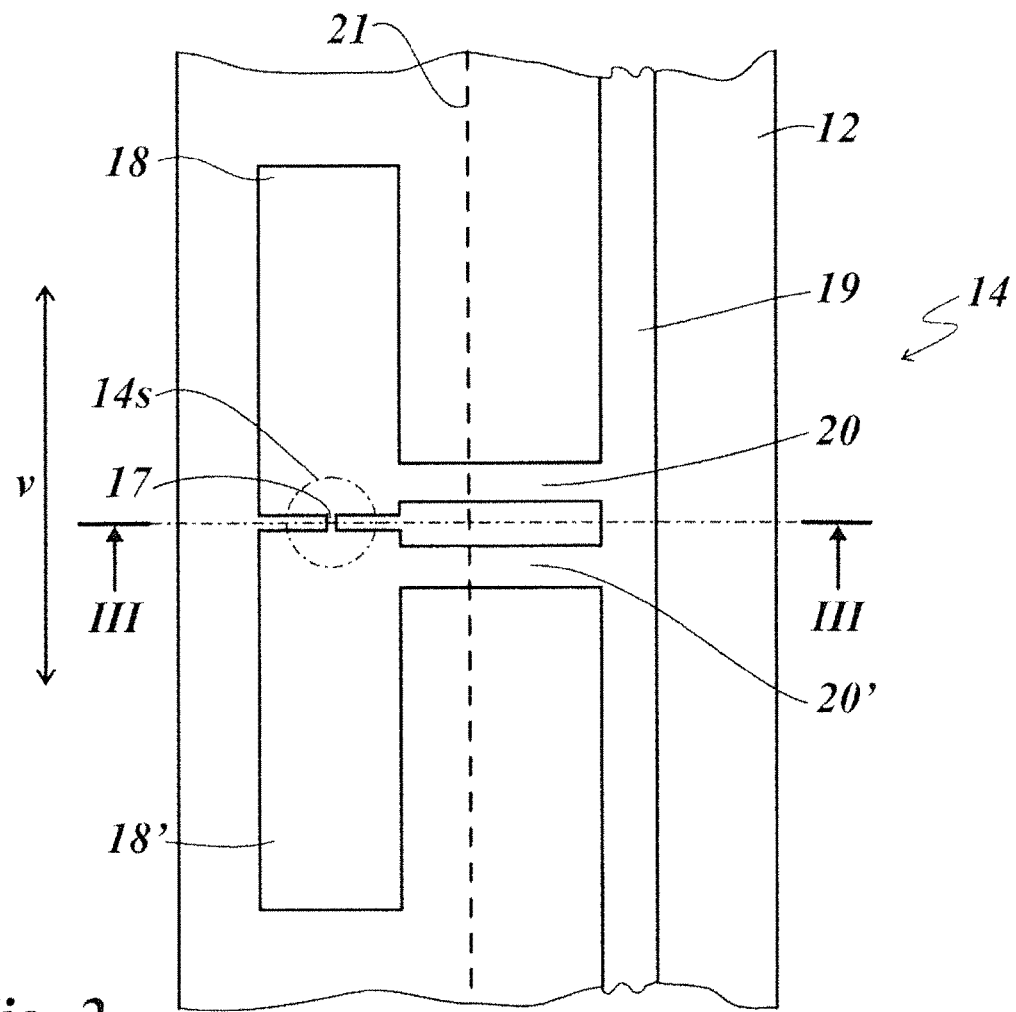
Figure 3:
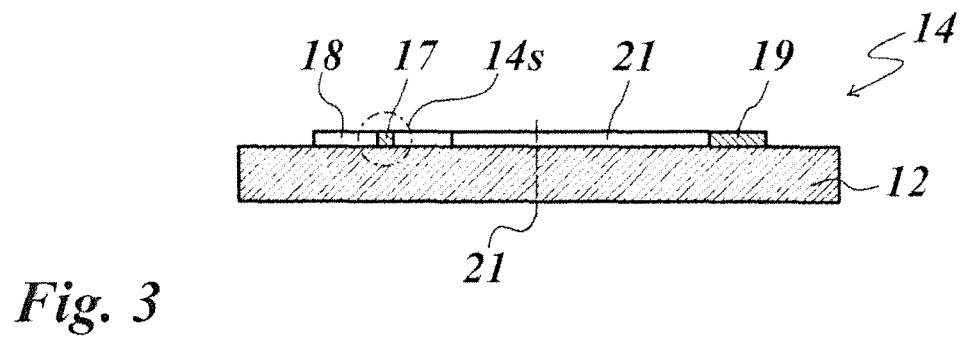
Figure 4:
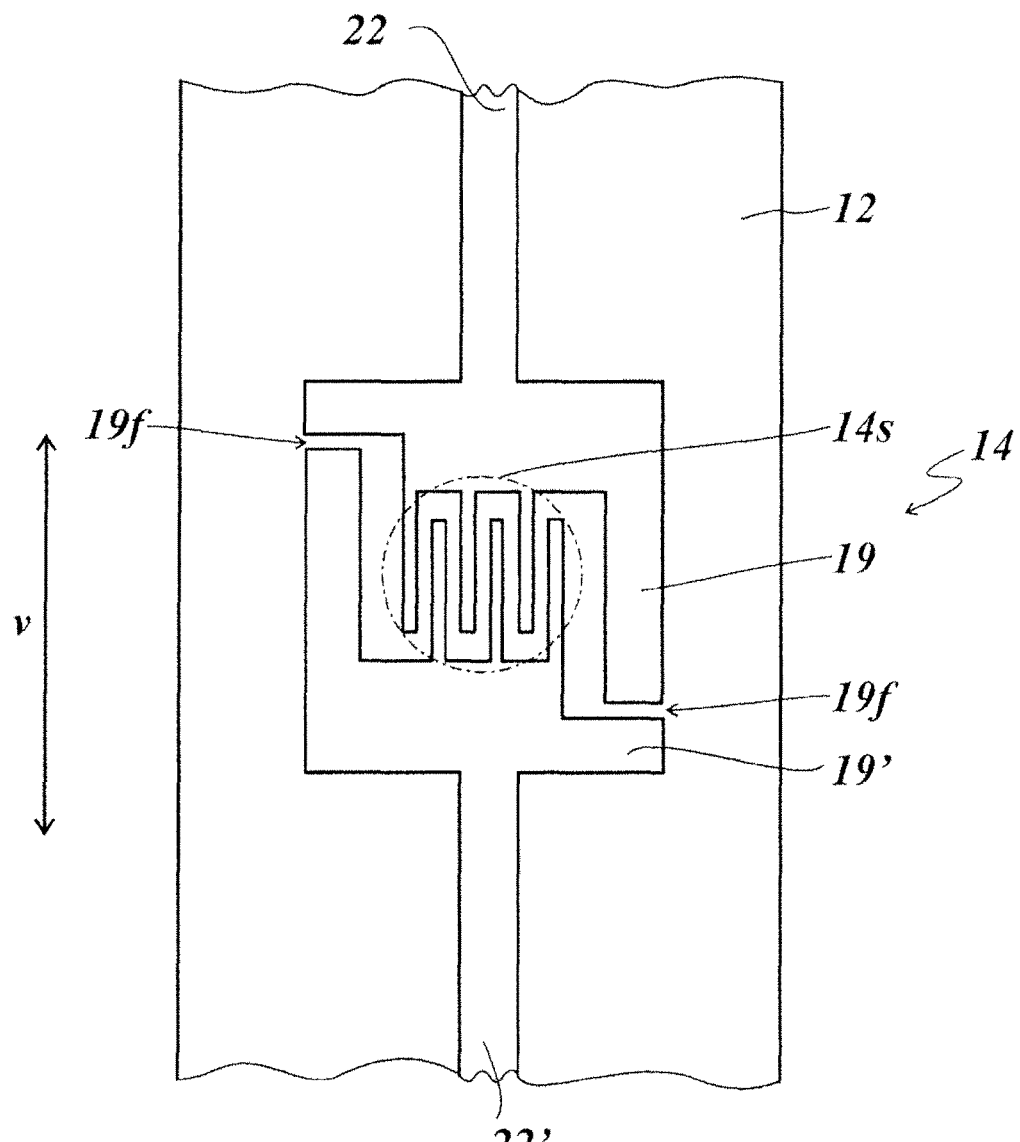
Figure 5:
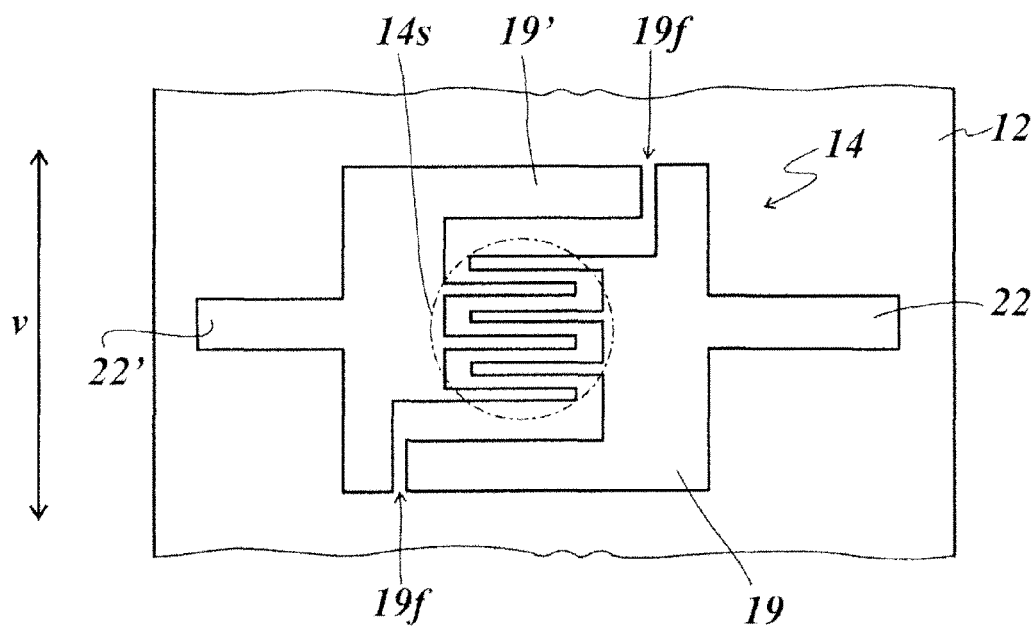
Figure 6:
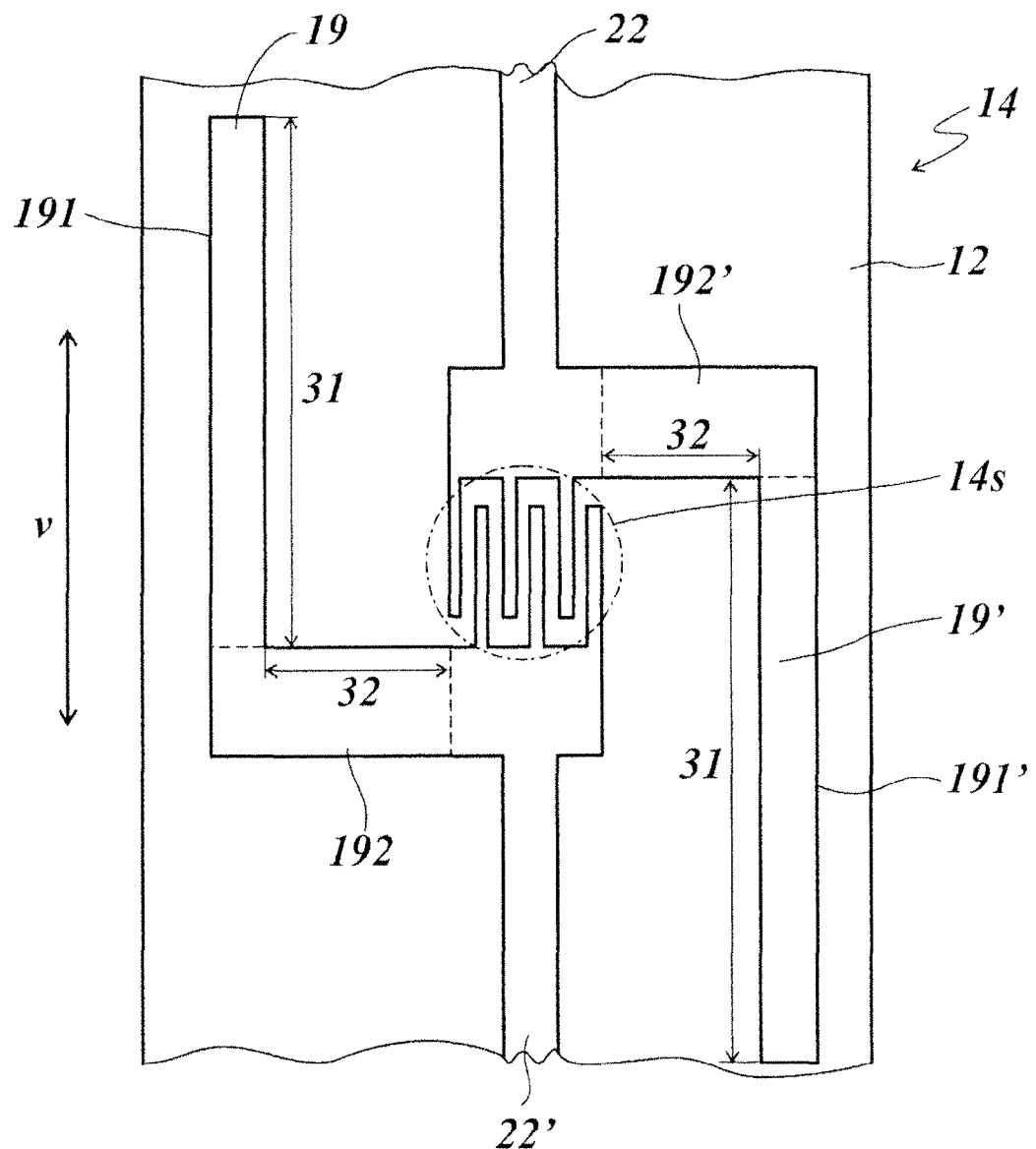

FIG. 1 a strip-type carrier film, having an electrically conductive structure, wound up on a carrier roll;

FIG. 2 a first embodiment example of the electrically conductive structure, in a schematic top view;

FIG. 3 the electrically conductive structure, in a schematic longitudinal section along the section line III-III in FIG. 2;

FIG. 4 a second embodiment example of the electrically conductive structure, in a schematic top view;

FIG. 5 a third embodiment example of the electrically conductive structure, in a schematic top view;

FIG. 6 a fourth embodiment example of the electrically conductive structure in a schematic top view.

FIG. 1 shows a film reel 13, which is formed from a strip-type carrier film 12 and from which a portion of the carrier film 12 has been drawn off. The direction of displacement of the carrier film is denoted by a direction arrow v, as also in the examples that follow. The film reel 13 is wound up on a winding roll 11. The carrier film 12 is composed of an electrically non-conductive, thermoplastic plastic, for example of PET, PN or PP. On its surface that faces towards the film reel 13, the carrier film 12 has electrically conductive structures 14, which are disposed successively in a row. The structures 14 can have both electrically conductive and semiconducting structural elements. A wedge-shaped separation gap 15 is realized between the drawn-off portion of the carrier film 12 and the film reel 13.

Preferably, the electrically conductive structures 14 in this case are composed of one or more layers, selected from the group comprising electrically conductive layer, electrically semiconducting layer and electrically insulating layer, which are applied to the carrier film 12 in succession in a roll-to-roll process. The structures 14 in this case preferably realize, respectively, a field-effect transistor, a diode, a resistor or a capacitor, or sub-elements thereof. Preferably in this case, one or more of the layers from which the structures 14 are composed are applied by means of a printing method.

During or after the production of the conductive structures 14 in the roll-to-roll process, extremely high static electrical voltages can occur in the electrically non-conducting carrier film 12 as a result of friction between rollers and the carrier film 12, or as a result of the reeling-up and unreeling of the carrier film 12. These voltages are taken up and carried by the electrically conductive structures 14 applied to the carrier film 12. As the carrier film 12 is being reeled off from the film reel 13, as represented in FIG. 1, this voltage runs on concomitantly in the separation gap 15. At the end regions of the conductive structures 14, a voltage flashover occurs, from this structure into the succeeding structure or into the opposite side of the film reel 13. This voltage flashover can damage functionally relevant regions of the structure 14, with the result that these regions no longer conform to the specified layout. In order to prevent the structure 14 from being damaged, at least one protective conductor 19 is provided, which keeps the static overvoltage away, at least from the regions 14s of the structure 14 that are to be protected.

FIGS. 2 and 3 show a first embodiment example.

The structure 14 disposed on the carrier film 12 has a structural region 14s to be protected. Disposed in the structural region 14s there is a fuse 17, which is realized as a conductor track and which electrically connects the supply lines 18 and 18' to each other. The supply lines 18 and 18' can also be realized as capacitive coupling surfaces. The supply lines 18 and 18' and the fuse 17 are provided to connect a voltage source to an electric circuit. The voltage source and the electric circuit are not represented in FIGS. 1 and 2. The fuse 17 can be provided, for example as an overcurrent fuse, to protect the electric circuit.

Realized on the carrier film 12, parallel to the supply lines 18 and 18, there is a protective conductor track 19, which is connected to the supply lines 18 and 18' via solid connecting portions 20 and 20'. The connecting portions 20 and 20' are disposed close to the fuse 17. In the embodiment example represented in FIGS. 1 and 2, the protective conductor track 19 and the supply lines 18 and 18' are composed of Ag or Cu, and have a width of 200 µm and a layer thickness of 50 nm. The resistance of the protective conductor track 19 and of the connecting portions 20 and 20' is one order of magnitude, i.e. 10 times, less than the resistance of the fuse 17.

As a result of this connection arrangement, the fuse 17 is short-circuited by connecting portions 20, 20' and the protective conductor track 19, with the result that no high voltage, which can result in damage to the fuse 17, can drop across the fuse 17.

The protective conductor track 19 is intended to be separated off at the cutting line 21, following singling of the structures 14, with the result that the fuse 17 is then no longer bypassed by the protective conductor track 19, and is therefore functional.

FIG. 4 shows a second embodiment example, in which the structural region to be protected is realized as a first electrode plane of a field-effect transistor. The source and drain electrodes are realized as protected structural elements. The source electrode of the field-effect transistor is connected to a supply line 22, and the drain electrode is connected to a supply line 22', wherein both supply lines extend in the longitudinal direction of the carrier film 12. The protective conductor tracks 19 and 19', realized substantially as angular protective surfaces, surround the structural region 14 to be protected, i.e. in relation to the direction of running, they are over and/or under the structural region to be protected. The protective conductor track 19 is realized to be integral with the supply line 22 and the source electrodes. The protective conductor track 19' is realized to be integral with the supply line 22' and the drain electrodes. The drain electrode of the field-effect transistor, the source electrode of the field-effect transistor and the protective conductor tracks 19 and 19' are in this case realized in a common electrically conductive layer of the film.

Flashover regions 19f are realized between mutually adjoining end portions of the protective conductor tracks. The flashover regions 19f are electrically conductive in the case of a voltage flashover and thus briefly connect the two protective conductor tracks 19 and 19', with the result that the source electrodes and the drain electrodes of the field-effect transistor are short-circuited and protected against being destroyed by overvoltage. In the embodiment example represented in FIG. 4, the flashover regions 19f have a gap width of 10 µm. They thereby protect against overvoltages of several kilovolts. It is optimal if the overvoltage region distance additionally has a distance that is the same as or less than the source/drain electrodes (channel).

FIG. 5 shows a third embodiment example, which is constructed in the same way as the second embodiment example described in FIG. 4, with the difference that the structure 14 disposed on the carrier film 12 has been rotated by 90°. It is thus possible to realize differing designs, provided that it is ensured that the protective structures are disposed over and/or under the structural region to be protected, in relation to the direction of running.

FIG. 6 shows a fourth embodiment example, which is constructed in the same way as the second embodiment example described in FIG. 4, with the difference that the protective conductor tracks 19 and 19', preferably realized as an L shape, do not completely surround the structural region 14s to be protected, and that no spark gaps are realized. The direction for a possible flashover is not defined, and it is possible for the protective conductor tracks 19 and 19' to be damaged. Since the latter do not have to perform any function beyond overvoltage protection, however, that is acceptable.

The protective conductor tracks 19 and 19' in this case each consist of an end portion 191 and 191', respectively, and a connecting portion 192 and 192', respectively. The end portions 191 and 191' serve here to discharge overvoltages. The end portions 191 and 191' have a length 31 that is greater than 1 mm, preferably greater than 10 mm and which, particularly preferably, is less than 10 cm, particularly preferably less than 20 cm. Preferably, the length of the end portions 191 and 191' is between 10 mm and 20 cm.

The width of the end portions 191 and 191' is preferably between 10 μm and 200 μm, particularly preferably between 50 μm and 150 μm. The end portions are preferably realized in the form of a conductor track, whose width is considerably less than its length. In this case, the end portions, at their one end, have an outside face designed to discharge overvoltages. At their other end, the end portions 191 and 191, as shown in FIG. 6, are connected, via the connecting portions 192 and 192, respectively, to the supply lines 22 and 22', respectively, of the protected structural element 14s, or to the source and drain electrode of the field-effect transistor, whose electrode layer is constituted by the protected structural element 14s. The connecting portions 192 and 192' preferably have a length 32 of between 0.5 cm and 1.5 cm, and preferably have a width that is greater, preferably at least twice as great, as the width of the associated end portion 191, 191'.

As shown in FIG. 6, the end portions 191 and 191', apart from the connecting portions 192 and 192', are not connected to any conductive structure of the film, and are therefore electrically contacted merely via the connecting portion. The charge is thus directed in the direction of the outside face of the end portion, and is discharged there, by means of a flashover, to the back side of the carrier or to a roller of a production machine. It is highly probable in this case that a partial region of the end portions 191 and 191' is destroyed. This is of no significance, however, since the regions of the end portions 191 and 191' that are oriented towards the outside face are designed as sacrificial regions, whose function consists in being destroyed upon discharging overvoltage. Preferably in this case, the sacrificial region has a length of between 1 mm and 5 cm, particularly preferably between 0.5 cm and 1.5 cm.

As shown in FIG. 6, the end portions 191 and 191' are oriented substantially longitudinal to the direction of running of the strip-type carrier film 14. The connecting portions 192 and 192' are preferably oriented transverse to the direction of running of the carrier film. The resultant L-shaped configuration of the protective conductor tracks 19 and 19' achieves the advantage that, on the one hand, charges that occur are safely discharged (owing to the transverse orientation of the connecting portions 192 and 192'), and (owing to the longitudinal orientation of the end portions) the charge flashover does not result in destruction of regions of the protected structural elements.

The L-limbs of that are oriented parallel to the longitudinal axis of the carrier film 12 are realized to be significantly longer than the other L-limbs, and have outside faces via which overvoltages are discharged. They have to be made longer, since there is no "continuing" conductor track, and it is very probable that the flashover will be effected into the back side of the carrier. The said outside faces are at such a distance from the structural region 14 to be protected that a voltage flashover does not enter the latter. It can be provided that the outside faces of the L-limbs oriented parallel to the longitudinal axis of the carrier film 12 are made to taper to a point, in order to trigger a point discharge there for the purpose of removing the overvoltage.

Further, it is also possible for the protective conductor tracks 19 and 19' not to have an L-shaped configuration, and for the connecting portions 192 and 192 and the end portions 191 and 191' to be oriented in a different angular position in relation to each other and, possibly, also to be oriented in the same direction.

It is thus possible, for example, for the end portions 191 and 191' to be likewise oriented transverse to the direction of running of the film, and in this case the connecting region 192 and 192' may also possibly be omitted. In respect of the dimensions of the connecting portions and the end portions, reference is made to the statements above relating to the connecting portions 192 and 192' and to the end portions 191 and 191'. Preferably in this case, the end portions of the protective conductor tracks are oriented towards a longitudinal edge of the films, with the result that the (partially destroyed) end portions can be separated off by means of a single cut following completion of the production process.

Further, it is also possible for the end portions of the protective conductor tracks to be disposed parallel to each other, and to be disposed to extend substantially in the direction of running of the strip type carrier film 12, and for the connecting portions to have a corresponding configuration, in order to connect these end portions, extending parallel, to supply lines and/or electrodes of one or more protected structural elements.

LIST OF REFERENCE NUMBERS

11 Winding roll
12 Carrier film
13 Film reel
14 Electrically conductive structure
14s Structural region to be protected
15 Wedge-shaped separation gap
16 Protective conductor
17 Fuse
18,18' Supply line/capacitive coupling surface
19, 19' Protective conductor track
19f Flashover region
20, 20' Connecting portion
21 Cutting line
22, 22' Supply line
191, 191' End portion
192, 192' Connecting portion

The invention claimed is:

1. A film having overvoltage protection for electrically conductive structures applied to the film comprising:
   an electrically non-conductive, electrostatically chargeable carrier film; and
   a structure on the carrier film comprising one or more electrically conductive and/or semiconducting structural elements and having at least one structural region protected against electrostatic voltage flashover, the one or more electrically conductive or semiconducting structural elements being connected to a protective conductor track and/or surrounded by a protective conductor track, such that the protective conductor track discharges an electrostatic charge that might otherwise occur on the structure and/or shields the protected structural region from receiving an electrostatic charge;
   wherein the protected structural elements include terminal connections, and wherein the connecting portions are electrically connected, directly or indirectly, to the terminal connections of the protected structural elements; or
   wherein the protected structural elements have supply lines, and two or more protective conductor tracks are provided connected to the supply lines.

2. The Film according to claim 1 wherein the protected structural region is a fuse structured as a conductor track.

3. The Film according to claim 1 wherein the protected structural element is one of a field-effect transistor, diode, resistor or capacitor, or a partial region thereof.

4. The film according to claim 1 wherein the protected structural element is composed of one or more layers, applied to the carrier film by printing, which layers are selected from the group comprising electrically conductive layer, electrically semiconducting layer and electrically insulating layer.

5. The film according to claim 1 wherein the protective conductor track short-circuits a structural element in the protected structural region that is connected to the structural element via connecting portions.

6. The film according to claim 1 wherein the protected structural region has outer edges, the two or more protective conductor tracks are disposed along the outer edges of the protected structural region and surround at least 50% of the latter.

7. The film according to claim 1 including adjacent protective conductor tracks wherein a flashover region is between the adjacent protective conductor tracks.

8. The film according to claim 7 wherein the flashover region has a gap width in the range of from 1 μm to 100 μm.

9. The film according to claim 7 wherein the carrier film has a length that runs in a given direction, at least one of the protective conductor tracks is disposed such that the flashover region is disposed over and/or under the structure to be protected, in relation to the direction of running of the film.

10. The film according to claim 1 wherein the carrier film is elongated running in a given direction, the protective conductor track is disposed substantially transverse to the direction of running of the carrier film.

11. The film according to claim 1 wherein one or more protective conductor tracks are provided, which are each connected to a supply line or an electrode of the protected structural element, and which have an end portion for discharging overvoltages.

12. The film according to claim 11 wherein the end portion has a length of between 1 mm and 20 cm.

13. The film according to claim 11 wherein the end portion has a width of between 10 μm and 200 μm.

14. The film according to claim 11 wherein the end portion is in the form of a conductor track, one end of which has an outside face for discharging overvoltages, and the other end of which is connected, via a connecting portion of the protective conductor track to a supply line or an electrode of a protected structural element, and which, apart from this connecting portion of the protective conductor track, is not connected to any conductive structure of the film.

15. The Film according to claim 14 wherein the outside face of the end portion is disposed at a distance of between 1 mm and 20 cm from the protected structural region.

16. The film according to claim 11 wherein the end portion has a length of between 1 mm and 5 cm designed to be destroyed upon discharging of overvoltages.

17. The film according to claim 11 wherein the carrier film is elongated, the end portion extends substantially longitudinal to the direction of running of the carrier film, and/or the outside face of the end portion is disposed on a side of the protected structural element transverse to the direction of running.

18. A method for forming a film comprising forming an electrically non-conductive, electrostatically chargeable carrier film and forming a structure on the carrier film that has one or more electrically conductive and/or semiconducting structural elements wherein the one or more electrically conductive or semiconducting structural elements are formed connected to at least one or more protective conductor tracks on the carrier film and/or are surrounded by the at least one or more protective conductor tracks such that the one or more protective conductor tracks discharges or discharge an electrostatic charge and/or shields or shield a protected structural region of the structure on the film wherein the at least one of the protective conductor tracks constitute a ring that is at least 50% closed.

19. The method according to claim 18 including forming the one or more electrically conductive or semiconducting structural elements of one or more layers applied to the carrier film, and which layers are selected from the group comprising an electrically conductive layer, an electrically semiconducting layer and an electrically insulating layer, and applied to the carrier film by printing.

20. The Method according to claim 18 including the step of removing charges applied to the structural elements during the process of producing the film by disposing a flashover region between adjacent protective conductor tracks, or via an end portion of the protective conductor track designed for discharging charges and that is at least partially destroyed upon discharging the charges.

21. The method according to claim 18 including separating the structure from a strip reel, and after the structure has been separated from the strip reel, separating the protective conductor track from the structure.

22. The method according to claim 18 wherein the method is a stage of a roll-to-roll process.

23. The method according to claim 18 including forming electrodes and then forming the protective conductor track and electrodes of the protected electrically conductive or semiconducting structural elements as parts of a common electrically conductive layer.

24. The method according to claim 23 wherein the common electrically conductive layer is subsequently printed, partially or as a semiconducting layer, and forming the electrodes as electrodes of a field-effect transistor, diode, resistor or capacitor.

* * * * *